United States Patent [19]

Howorth et al.

[11] 4,060,823

[45] Nov. 29, 1977

[54] ELECTRON-EMISSIVE SEMICONDUCTOR DEVICES

[75] Inventors: Jonathan Ross Howorth, Maldon; Alan Jerome Goss, Chelmsford; Peter James Pool, Maldon, all of England

[73] Assignee: English Electric Valve Company Limited, England

[21] Appl. No.: 675,693

[22] Filed: Apr. 9, 1976

[30] Foreign Application Priority Data

Apr. 11, 1975 United Kingdom ............... 15094/75

[51] Int. Cl.$^2$ ............................................ H01L 27/14

[52] U.S. Cl. ......................................... 357/30; 357/4; 357/52; 357/48; 357/32

[58] Field of Search .................. 357/30, 32, 52, 4, 31, 357/48

[56] References Cited

U.S. PATENT DOCUMENTS

| | | | |
|---|---|---|---|
| 3,699,404 | 10/1972 | Simon | 317/235 R |
| 3,808,477 | 4/1974 | Swank | 317/235 N |

*Primary Examiner*—Martin H. Edlow

*Attorney, Agent, or Firm*—Diller, Brown, Ramik & Wight

[57] ABSTRACT

An electron-emissive semiconductor device such as a photocathode or an electron multiplier, consists of separate regions of semiconductor material spaced apart by a barrier which reduces current flow between the regions. The barriers improve the performance of the device by preventing excess electron emission currents and reduce image spreading.

7 Claims, 4 Drawing Figures

ELECTRON-EMISSIVE SEMICONDUCTOR DEVICES

Figure 1:
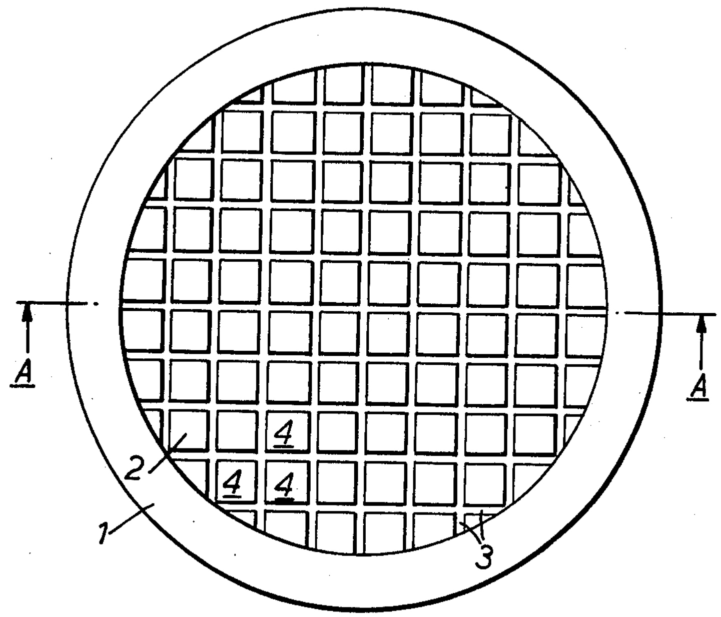

This invention relates to electron-emissive semiconductor devices which emit electrons when subjected to a stimulus such as incident light or primary electrons. Thus the term electron-emissive semiconductor devices is intended to cover for example photocathodes and electron multipliers.

According to this invention an electron-emissive semiconductor device comprises first and second substantially parallel surfaces which are spaced apart from one another by intervening electron-emissive semiconductor material, the first surface of which is provided with a layer or coating of a material which provides a reduction in the surface work function of the semiconductor material so that electrons are emitted from said first surface when said second surface is subjected to an incident stimulus, the semiconductor material consisting of localized elemental regions which are separated from each other by barrier means which inhibit current flow between the different elemental regions.

Conveniently the localized elemental regions are aligned in rows and columns to form a regular matrix.

The barrier means can consist of high resistance or insulating material, or alternatively can consist of a p-n junction which in operation is reversed biased to restrict electron conduction from one localised elemental region to another.

In those cases where the semiconductor material is p-type, preferably the barriers are constituted by n-type channels which extend from one surface of the device to the other.

Alternatively the barrier means consist of a material which is inherently non-conductive, such as silicon oxide. Again the barrier means extend from one surface of the device to the other.

The semiconductor material that is used to form the localised elemental regions depends on the purpose for which the device is to be used. For example devices consisting of silicon, gallium-arsenide or gallium-aluminium-arsenide are particularly suitable as electron multipliers and devices consisting of silicon, gallium-arsenide, indium-gallium-arsenide, or indium-arsenide-phosphide can be used as photocathodes.

The separation of the semiconductor material into localised elemental regions permits the device to be protected against the effects of excessive electron emission currents which could cause gas generation, temporary overheating or even permanent damage to the device. As electrons are emitted from a particular localised elemental region, that region adopts an increasingly positive potential which opposes further electron emission and in practice provides an upper limit on the electron current that can be emitted.

A further effect of the separation of the semiconductor material into localised elemental regions is that so-called image spreading can be reduced. Some electrons produced within the semiconductor material by the incident stimulus tend to travel laterally through the semiconductor material and the barriers prevent electrons spreading any great distance. The effect is most pronounced when a high intensity stimulus is present, and the barrier confines the overload to a particular localised elemental region. The term originated with optical image devices, and although used her primarily in connection with photocathodes the same effect is applicable in principle to images produced by incident electrons.

Figure 2:
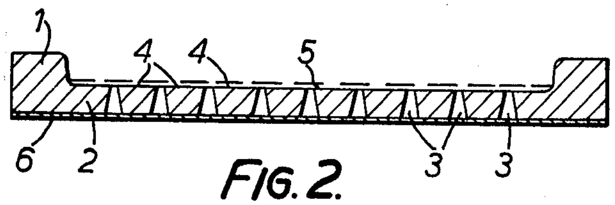
Figure 3:
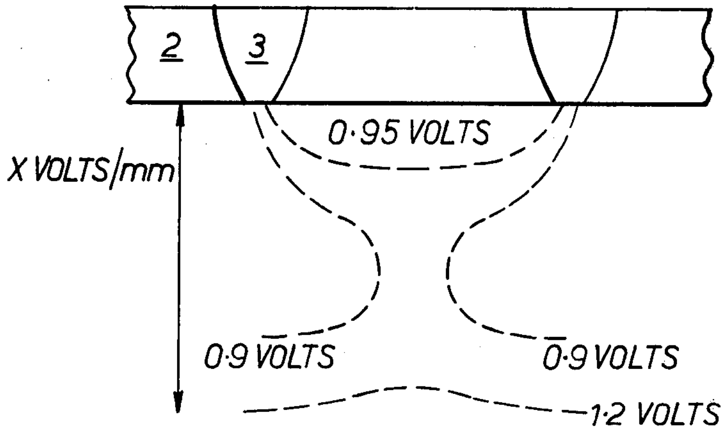
Figure 4:
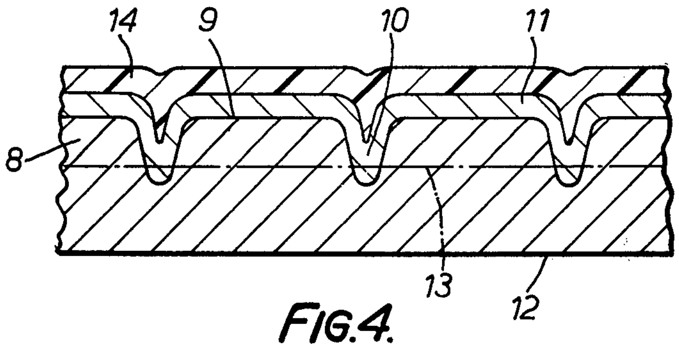

The invention is further described, by way of example, with reference to the accompanying drawings in which, FIG. 1 shows a plan view of an electron-emissive semiconductor device in accordance with this invention, FIG. 2 illustrates a section view taken on the line AA of FIG. 1, FIG. 3 is an explanatory diagram used in connection with FIGS. 1 and 2 and FIG. 4 is a section view, similar to FIG. 2, and which shows stages in the production of a further embodiment of the present invention.

Referring to FIGS. 1 and 2, an electron emissive semiconductor device, in this case a photocathode, consists of a body of p-type silicon having a relatively massive peripheral frame 1 which supports a relatively thin membrane portion 2. Typically the membrane is about 5 $\mu$m thick. The membrane portion 2 consists of a regular matrix of localised elemental regions 4, (hereafter termed elements) of the p-type silicon which are separated from each other by n-type channels 3, which in operation act as a barrier to prevent or reduce the flow of electrons from one element 4 to another. A first surface of the device is provided with a thin coating 5 of caesium oxide which reduces the work function of this surface, and enhances the emission of electrons therefrom when a second surface 6 of the device is illuminated with light. The incident light acts as a stimulus and releases electrons from the silicon which, by virtue of the reduced work function caused by the caesium oxide, are emitted from the first surface of the device. The emission is enhanced by the presence of a focussing or accelerating electrode (not shown) positioned in front of the first surface. A further electrode (not shown) is connected to the frame 1.

The n-type channels are very narrow and in the present example are formed by diffusion from the second surface 6. The n-type dopant is phosphorous. The width of each channel varies between about 3 $\mu$m and 20 $\mu$m; the mean width is about 10 $\mu$m, and the channels are spaced apart from each other by about 0.2 mm. The diffusion step is fairly conventional and so will not be described in detail. The inpurity concentration of the p-type silicon is about $10^{19}$ per cc and that of the n-type channels is about $10^{20}$ per cc. The concentrations are fairly high in order to withstand the high temperature out-gassing to which the device is subjected during manufacture to produce the negative electron affinity necessary at the first surface to effect electron emission. The method of producing an electron-emissive semiconductor device which consists of a relatively strong peripheral frame surrounding and supporting a thin membrane coated with a work-function reducing material is described in greater detail in our copending patent application No. 1166/73.

In operation the n-type channels provide a high degree of insulation against the lateral flow of current from one element to the next, since all elements are effectively isolated by the p-n-p junctions. When electrons are emitted from a particular element this is equivalent to a current flow and a potential is set up across the p-n junction. This causes the element to become charged to a positive potential V and gives rise to an electric field at the surface which is dependent on the size L of the element; the field is proportional to V/L.

When this field becomes comparable to any external field, i.e. the accelerating or focussing field, the equipotentials become distorted as shown in FIG. 3. Typical potential values are indicated, and the presence of a potential hill in front of the charged element restricts further electron emission. At this stage the current drawn is saturated, and can be further increased only by increasing the value of the focussing or accelerating field (X) or by increasing the leakage current across the p-n junction in order to reduce V. The leakage current is provided via the further electrode referred to previously connected to the frame 1.

For a photocathode, an electron current is emitted which is proportional to the intensity of illumination up to a level corresponding to the saturation current. Any further increase in the intensity of the incident illumination produces no further increase in the emission current. This provides built-in protecion against local overloads.

Typical figures are as follows. For a field strength X of 50 volts/mm, the values of V and L are 10 volts and 0.2 mm respectively. The reverse bias leakage for the equivalent silicon diode (p-n junction) is about $10^{-14}$ amps at 10 volts bias potential, and since the area of each localised island region is about $4 \times 10^{-4}$sq. cms. this corresponds to a current density of $2.5 \times 10^{-9}$ amps/sq. cm. for saturation.

In the case of photocathodes these overload situations commonly arise in images representative of night scenes. For night scenes, the photocathode current density for shadows is of the order of $10^{-14}$ amps/sq. cm, and normal highlights at night give rise of photocurrents of about $10^{-10}$ amps/sq. cms. These current densities are acceptable, but currents in excess of $10^{-8}$ amps/sq. cm may result in gas generation or image spreading, depending on the nature and dimensions of a particular device.

Overloads are usually compensated for by an automatic iris or an automatic gain control if the overload covers a large proportion of the scene size, but these safeguards provide little protection against small area overloads which can cause image spreading and consequent loss of information. The use of the barrier means (i.e. the n-type channels shown in FIGS. 1 and 2) also inhibits image spreading in addition to providing the overload protection discussed previously. The presence of the n-type channels prevents a continuous high conductivity path existing across an electron emissive semiconductor device and confines the electron emission to the element subjected to the incident illumination.

For photocathodes it is clearly desirable that each element shall be a very small proportion of the total photocathodes area. For picture information the smallest recognisable object will usually occupy between 0.01% and 1% the total picture area.

FIG. 4 illustrates part of a sectional view of an electron-emissive semiconductor device in which the barrier means is not constituted by a p-n junction. As with FIGS. 1 and 2 the device consists of a relatively massive frame which supports a thin membrane. In FIG. 4, only a portion of this membrane is shown. It is formed from a body of semiconductor material 8, which is etched from one surface 9 to form deep channels 10. Etchants are known which etch preferentially in selected crystal planes, and the orientation of the semiconductor material and the type of etchant are chosen to give deep narrow channels. The surface 9 and the channels 10 are then coated with a layer 11 of silicon oxide by an convenient known method. A further layer 14 may be grown on top of the oxide layer 11 if desired to improve the mechanical strength of the surface. This further layer 14 must be capable of passing light and preferably is silicon or a silicon compound. The reverse face 12 of the semiconductor material is etched uniformly to reduce the thickness of the membrane until the oxide layer 11 appears. At this stage the oxide layer 11 forms an insulating barrier completely round each element.

The new surface 13 is coated with a thin layer of caesium oxide to reduce the work function and during operation electrons are emitted from this surface.

The operation of the device represented in FIG. 4 is analogous to the embodiments of the invention previously described, and in particular provides overload protection and prevents image spreading occuring. As before, the term image spreading is not restricted to photocathodes, but covers the situation where an electron multiplier is subjected to a pattern of incident electrons. The leakage current which replaces the emitted electrons, has a very low value and in practice, although silicon oxide is usually considered as an insulator, a suitable leakage current can flow through the silicon oxide to the individual elements.

We claim:

1. An electron-emissive semiconductor device comprising first and second substantially parallel surfaces which are spaced apart from one another by intervening electron-emissive semiconductor material, the first surface of which is provided with a layer or coating of a material which provides a reduction in the surface work function of the semiconductor material so that electrons are emitted from said first surface when said second surface is subjected to an incident stimulus, the semiconductor material consisting of localized elemental regions which are separated from each other by barrier means which extend from said first to said second surface to isolate said regions from each other and inhibit current flow between the different elemental regions.

2. A device as claimed in claim 1 and wherein the localized elemental regions are aligned in rows and columns to form a regular matrix.

3. A device as claimed in claim 1 and wherein the barrier means consists of high resistance or insulating material.

4. A device as claimed in claim 1 and wherein the barrier means consists of a p-n junction which in operation is reversed to restrict electron conduction from one localised elemental region to another.

5. A device as claimed in claim 4 and wherein the electron-emissive material is p-type and the barriers are constituted by n-type channels which extend from one surface of the device to the other.

6. A device as claimed in claim 3 and wherein the barrier means is silicon oxide.

7. An electron-emissive semiconductor device comprising, in combination:

a body of electron-emissive semiconductor material having a membrane-like portion thereof presenting closely spaced and substantially parallel opposite side surfaces;

means on one of said surfaces for reducing the surface work function of the semiconductor material whereby the other surface of the membrane-like portion may be subjected to incident stimulus such as incident light or primary electrons to produce electron emission from said one surface; and barrier means within said membrane-like portion separating said semiconductor material into discrete, elemental regions physically isolated form each other by said barrier means for limiting electron emissions from said elemental regions and for restricting current flow between said elemental regions when said other surface is subjected to incident stimulus.

* * * * *